United States Patent

Smayling et al.

[11] Patent Number: 5,589,697
[45] Date of Patent: Dec. 31, 1996

[54] CHARGE PUMP CIRCUIT WITH CAPACITORS

[75] Inventors: Michael C. Smayling, Missouri City, Tex.; Luciano Talamonti, Rieti, Italy

[73] Assignee: Texas Instruments Incorporated, Dallas, Tex.

[21] Appl. No.: 473,051

[22] Filed: Jun. 7, 1995

Related U.S. Application Data

[62] Division of Ser. No. 270,090, Jul. 1, 1994, Pat. No. 5,479,040, which is a division of Ser. No. 65,694, May 21, 1993, Pat. No. 5,364,801, which is a continuation of Ser. No. 628,783, Dec. 17, 1990, abandoned.

[51] Int. Cl.$^6$ .................................................. H01L 29/788
[52] U.S. Cl. ...................... 257/204; 257/379; 257/476; 257/207; 257/315; 327/536; 327/537; 327/544; 365/104; 365/149
[58] Field of Search ........................................ 257/371, 377, 257/382, 476, 384, 379, 390, 391, 314, 315, 486, 204, 207; 327/536, 537, 544; 365/185.1, 149, 104, 102

[56] References Cited

U.S. PATENT DOCUMENTS

| | | | |
|---|---|---|---|
| 4,255,677 | 3/1981 | Boonstra et al. | 307/304 |
| 4,255,756 | 3/1981 | Shimotori et al. | 357/51 |
| 4,343,052 | 8/1982 | Guenther | 4/254 |
| 4,343,082 | 8/1982 | Lepselter et al. | 29/576 B |
| 4,491,746 | 1/1985 | Koike | 307/296 R |
| 4,533,647 | 8/1985 | Tien | 501/105 |
| 4,536,945 | 8/1985 | Gray et al. | 29/571 |
| 4,559,545 | 12/1985 | Iemura et al. | 346/155 |
| 4,559,548 | 12/1985 | Iizuka et al. | 357/23.6 |
| 4,571,656 | 2/1986 | Ruckman | 361/56 |
| 4,591,735 | 5/1986 | Karlock | 307/260 |
| 4,833,647 | 5/1989 | Maeda et al. | 365/182 |
| 4,874,714 | 10/1989 | Eklund | 437/39 |
| 4,877,748 | 10/1989 | Havemann | 437/31 |
| 5,190,886 | 3/1993 | Asahina | 437/41 |
| 5,475,335 | 12/1995 | Merrill et al. | 327/536 |
| 5,479,040 | 12/1995 | Smayling et al. | 257/371 |

*Primary Examiner*—William Mintel
*Attorney, Agent, or Firm*—Ira S. Matsil; James C. Kesterson; Richard L. Donaldson

[57] ABSTRACT

A charge pump (10) uses Schottky diodes (12) coupled to clock signals ($\phi_1$ and $\phi_2$) via respective capacitors (14a–d). Regulation and control circuitry 18 provides a stable voltage output and controls the clock circuitry (16).

25 Claims, 2 Drawing Sheets

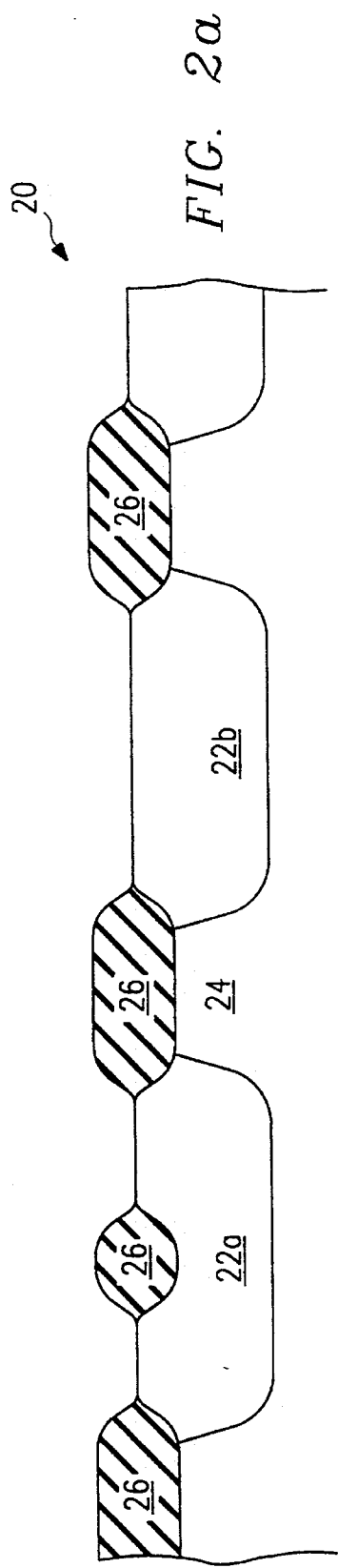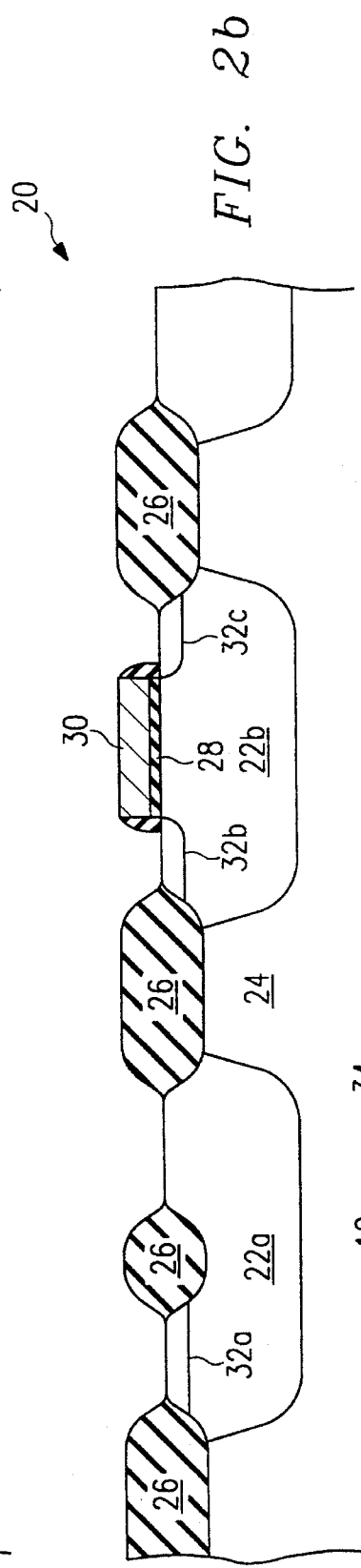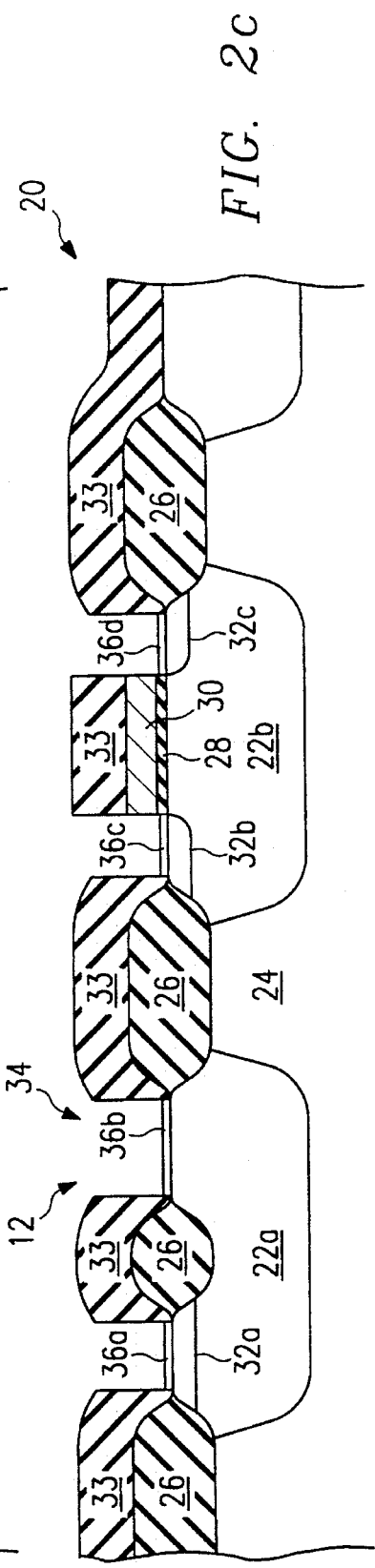

CHARGE PUMP CIRCUIT WITH CAPACITORS

This is a divisional of application Ser. No. 08/270,090, filed Jul. 1, 1994 and now U.S. Pat. No. 5,479,040 issued Dec. 26, 1995 which is a divisional of Ser. No. 08/065,694, filed May 21, 1993 and now U.S. Pat. No. 5,364,801 issued Nov. 15, 1994 which is a continuation of Ser. No. 07/628,783, filed Dec. 17, 1990 and now abandoned.

TECHNICAL FIELD OF THE INVENTION

This invention relates in general to integrated circuits, and more particularly to a charge pump circuit.

BACKGROUND OF THE INVENTION

In many circuits, it is necessary to generate a voltage which is greater in magnitude than the supply voltage. For example, EPROMs need a programming voltage ($V_{pp}$) of approximately twelve voltages. This voltage must normally be generated from a five volt supply coupled to the EPROM circuit. Similarly, EEPROMs require a $V_{pp}$) of approximately sixteen to seventeen volts which must be generated from the five volt supply voltage. In other instances, a negative voltage must be generated from a negative supply voltage of lesser magnitude or from the five volt supply.

EPROMs and EEPROMs are discussed in greater detail in connection with U.S. Pat. No. 4,569,117, to Baglee et al, issued Feb. 11, 1986, entitled "Method of Making Integrated Circuit With Reduced Narrow-Width Effect", U.S. Pat. No. 4,695,979, to Tuvell et al., issued Sep. 22, 1987, entitled "Modified Four Transistor EEPROM Cell", U.S. Pat. No. 4,669,177, to D'Arrigo et al., issued Jun. 2, 1987, entitled "Process for Making a Lateral Bipolar Transistor in a Standard CSAG Process", U.S. Pat. No. 4,715,014, to Tuvell et al., issued Dec. 22, 1987, entitled "Modified Three Transistor EEPROM Cell", U.S. Pat. No. 4,718,041, to Baglee et al., issued Jan. 5, 1988, entitled "EEPROM Memory Having Extended Life", U.S. Pat. No. 4,736,342, to Imondi et al., issued Apr. 5, 1988, entitled "Method of Forming a Field Plate In a High Voltage Array", U.S. Pat. No. 4,742,492, to Smayling et al., issued May 3, 1988, entitled "EEPROM Memory Cell Having Improved Breakdown Characteristics and Driving Circuitry Therefor", U.S. Pat. No. 4,797,372, to Verret et al., issued Jan. 10, 1989, entitled "Method of Making a Merge Bipolar and complementary Metal Oxide Semiconductor Transistor Device", U.S. Pat. No. 4,804,637, to Smayling et al., issued Feb. 14, 1989, entitled "EEPROM Memory Cell and Driving Circuitry", and U.S. Pat. No. 4,912,676, to Paterson et al., issued Mar. 27, 1990, entitled "Erasable Programmable Memory" all of which are incorporated by reference herein.

Typically, charge pumps are used to generate a voltage of increased magnitude. Present-day charge pumps comprise a series of stages, each stage including a capacitor and an MOS or junction diode. Each stage of the charge pump boosts the magnitude of the voltage signal by a voltage equal approximately to the voltage swing of a clock signal applied to the capacitor less the threshold voltage of the diode.

Typically, the clock signals vary between zero and five voltages. For an MOS diode, the voltage drop is approximately two to three volts, resulting in a voltage boost of approximately two to three volts per stage. A junction diode has a voltage drop of approximately 0.7 volts, resulting in a boost of approximately 4.3 volts per stage. Junction diode charge pumps are difficult to fabricate, however, since the n-well must remain positive with respect to the substrate. If the n-well becomes negative, a substrate diode will result.

The need to increase the density of integrated circuits dictates that the size of each subcircuit be minimized. By reducing the number of stages, i.e., by increasing the voltage boost of each stage, the size of the charge pump can be reduced.

Therefore, a need has arisen for a charge pump with a minimum area requirement.

SUMMARY OF THE INVENTION

In accordance with the present invention, a charge pump and a method of forming the same is provided which substantially eliminates problems associated with prior charge pump devices.

The charge pump of the present invention comprises first and second clocks having a predetermined phase differential. A plurality of Schottky diodes are coupled in series. A plurality of capacitors having first and second plates alternately couple respective diodes to said first and second clocks.

The charge pump of the present invention provides the advantage of a small forward voltage drop across the diode. Hence, the number of stages needed to produce a given voltage is reduced, thereby reducing the size of the charge pump circuitry.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2a–1c illustrate cross-sectional side views of a preferred embodiment of forming the charge pump of the present invention;

DETAILED DESCRIPTION OF THE INVENTION

The preferred embodiment of the present invention and its advantages are best understood by referring to FIGS. 1–4 of the drawings, like numerals being used for like and corresponding parts of the various drawings.

Figure 1:
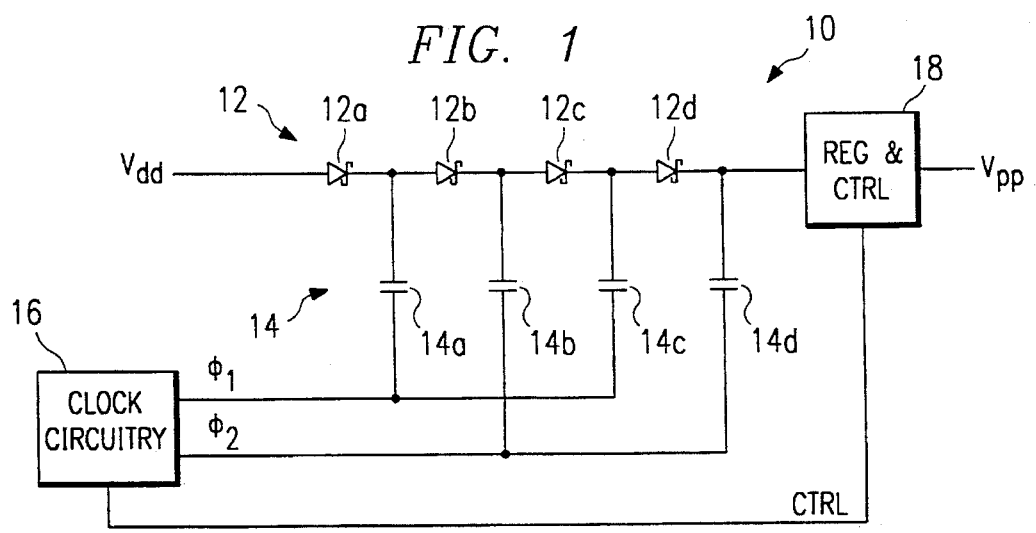
FIG. 1 illustrates a schematic representation of the preferred embodiment of the charge pump of the present invention.

FIG. 1 illustrates a schematic diagram of the preferred embodiment of the charge pump of the present invention. The embodiment shown in FIG. 1 is for a positive charge pump. A plurality of Schottky diodes, generally referred to by reference 12 and individually referred to as Schottky diodes 12a–d are connected in series. The anode of diode 12a is connected to voltage source $V_{dd}$, typically five volts. The cathode of each diode 12a–d is coupled to a first plate of a respective capacitor 14a–d, each capacitor referred to generally by reference numeral 14. The second plates of capacitor 14a and 14c are coupled to a first clock signal ($\phi_1$) produced by clock circuitry 16. The second clock signal ($\phi_2$) produced by clock circuitry 16 is connected to the second plates of capacitors 14b and 14d. The cathode of Schottky diode 12d is coupled to voltage regulation and control circuitry 18 which outputs a programming voltage signal $V_{pp}$. Voltage regulation and control circuitry 18 also outputs a control signal to clock circuitry 16.

In operation, the two clock phases, $\phi_1$ and $\phi_2$, are 180° out of phase and non-overlapping (i.e., having a work cycle slightly less than 50%). Hence, if $\phi_1$ is at five volts, $\phi_2$ is at zero volts and if $\phi_2$ is at five volts, $\phi_1$ is at zero volts. Initially, the node coupling the cathode of Schottky diode 12a and the first plate of capacitor of 14a will be at approximately 4.7 volts, accounting for a 0.3 volt forward voltage drop of Schottky diode 12a. As $\phi_1$ transitions from zero volts to five volts, capacitor 14a forces the voltage of the node to 9.7 volts.

While $\phi_1$ is at five volts, $\phi_2$ is at zero volts. At this point, the voltage at the cathode of Schottky diode 12b will be equal to 9.4 volts, accounting for the 0.3 volt forward voltage drop of diode 12b. When $\phi_2$ transitions from zero volts to five volts, the voltage at the cathode of diode 12b will be increased from 9.4 volts to 14.4 volts. This will cause a voltage at the cathode of Schottky diode 12c of 14.1 volts. At this point, $\phi_1$ is at zero volts; therefore, as $\phi_1$ transitions from zero volts to five volts, the voltage at the cathode of Schottky diode 12c will transition from 14.1 volts to 19.1 volts. Hence, the voltage at the cathode of Schottky diode 12d will be 18.8 volts. A transition of $\phi_2$ from zero volts to five volts will increase the voltage from 18.8 volts to 23.8 volts.

The cathode of diode 12d is coupled to the voltage regulation and control circuitry. The circuitry performs two functions. First, the voltage regulation and control circuitry 18 regulates the voltage at the cathode of Schottky diode 12d to provide a stable $V_{pp}$ of approximately seventeen volts for a EEPROM. Second, the voltage regulation and control circuitry provides a control signal to the clock circuitry to stop the clocks ($\phi_1$ and $\phi_2$) when a desired voltage is met and to restart the clocks when the voltage at the cathode of Schottky diode 12d drops below the desired level. The control circuitry is described in greater detail in connection with U.S. Pat. No. 4,628,487, to Smayling, entitled "Dual Slope, Feedback Controlled, EEPROM Programming", issued Dec. 9, 1986, which is incorporated by reference herein.

FIGS. 2a–c illustrate processing steps for fabricating one stage (comprising a Schottky diode 12 and a capacitor 14). FIG. 2a illustrates a cross-sectional side view of a stage 20 after initial processing steps. Tanks 22a–b are formed in a semiconductor substrate 24. The tanks are formed by masking the surface of the substrate with a thin oxide layer of approximately 400 angstroms and a nitride layer of about 1400 angstroms. The oxide/nitride layers are patterned and etched to define the tanks 22a–b. A dopant, such as phosphorus for a N type tank, is implanted in the exposed portions of the semiconductor surface. For example, for a low volume N tank implant, phosphorus may be implanted at 80 keV at a dose of $8.0 \times 10^{12}/cm^2$. The tanks 22a–b are driven into the substrate 24 with an anneal to a depth of about three microns.

The oxide/nitride layers are then removed, followed by deposition of an oxide and a nitride layer over the surface of the substrate. The nitride layer is patterned and etched to define locations where field oxide regions 26 are to be formed. By subjecting the wafer to high temperatures, the field oxide regions 26 are grown using a LOCOS (local oxidation of silicon) process.

FIG. 2b illustrates a cross-sectional side view of a charge pump stage after secondary processing steps. A thin oxide layer and a polysilicon layer are formed over the surface of the wafer. The oxide layer and polysilicon layer are patterned and etched to form a plate 30 and a dielectric 28 for a capacitor 12. A photoresist mask is formed over the surface of the structure and is patterned to expose regions in which N+ regions are to be formed. The mask is used to keep the N+ dopant out of the P+ and Schottky areas formed later in the processing. An N type dopant is implanted and annealed to form the N+ regions. For example, arsenic may be implanted at 120 keV at a concentration of $5.0 \times 10^{15}/cm^2$. The implanted regions may be annealed at 900° C. to form N+ regions 32a–c.

FIG. 2c illustrates a cross-sectional side view of the charge pump stage 20 after a tertiary processing steps. A doped glass layer 33 is deposited over the structure and is patterned and etched to expose the N+ regions 32a–c and a Schottky diode area 34. A layer of platinum is sputtered over the surface of the structure and is heated to approximately 500° C. The platinum will react at the surface of the substrate 24. Thus, PtSi 36a–d regions will be formed over the N+ areas 32a–c and in the Schottky diode area 34. Unreacted platinum is removed using an aqua regia solution.

A Schottky diode is formed by the PtSi region 36b and the tank 22a, due to the differences in the work function of the different regions. Because the work function between the other PtSi regions 36a, 36c, and 36d are substantially the same as the heavily doped N+ regions 32a–c, no Schottky diode is formed therebetween.

N+ region 32a forms the contact to the cathode of the Schottky diode 12. A capacitor is formed between the polysilicon plate 30 and the tank 22b. N+ region 32b acts as a contact to the second plate (tank 22b). A metal layer (not shown) is sputtered over the structure and patterned to couple plate 30 and PtSi region 36b (the anode of the Schottky diode) and to couple successive stages together.

Figure 3:
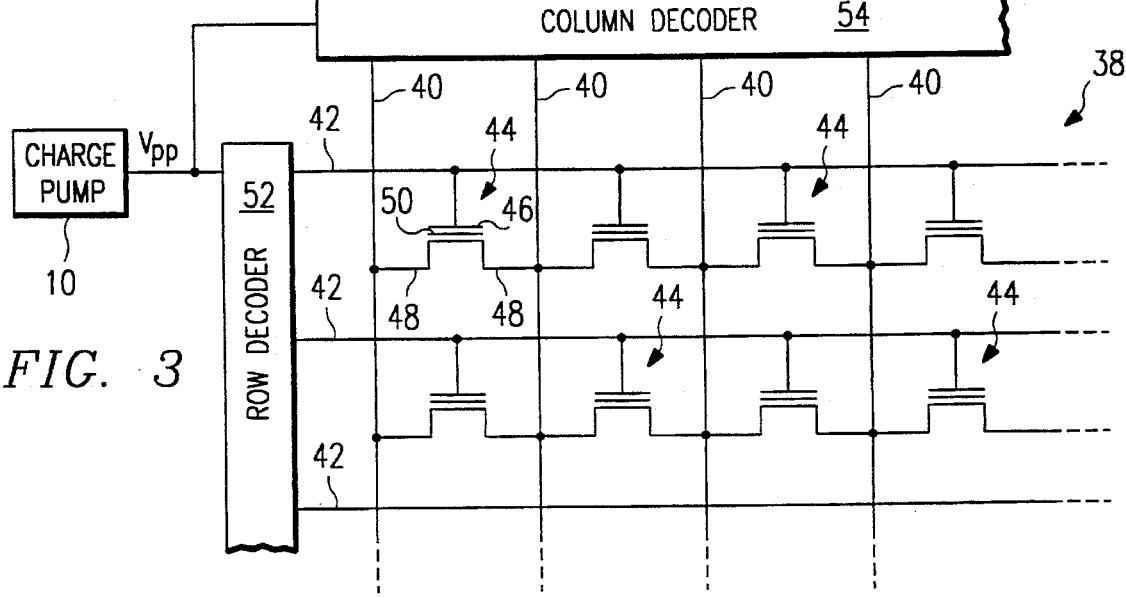
FIG. 3 illustrates a schematic representation of an EPROM array using the charge pump of the present invention.

FIG. 3 illustrates a schematic diagram of an EPROM array as would be coupled to the charge pump 10 of the present invention. An array of cells 38 comprises a plurality of bitlines 40, formed substantially perpendicular to a plurality of wordlines 42. The bitlines 40 and wordlines 42 are coupled to respective non-volatile memory cells, shown in FIG. 3 as EPROM or EEPROM cells 44. The wordlines 42 are coupled to control gates 46 of associated cells 44. Successive bitlines are coupled to the respective source/drains 48 of the cells 44.

A floating gate 50 is programmed by providing a high voltage on the control gate of a cell and passing current between the cells source/drain regions 48. A row decoder 52 is connected to the wordlines 42 and a column decoder 54 is connected to the bitlines 40. The row decoder selects one of the plurality of wordlines 42 to which is coupled. Column decoder 54 determines the bitline to which a voltage will be applied for programming or reading a cell 44.

Figure 4:
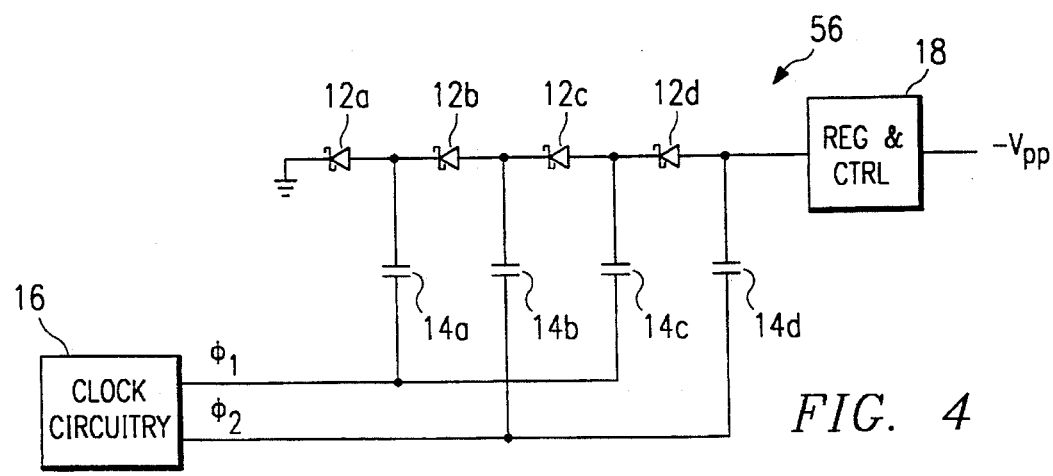
FIG. 4 illustrates a schematic representation of a negative charge pump.

FIG. 4 illustrates a schematic diagram of a negative charge pump. In this configuration, ground (or other voltage) is coupled to the cathode of a diode 12a. One plate of capacitor 14a is coupled to the anode of Schottky diode 12a and to the cathode of Schottky diode 12b. The other plate of capacitor 14a is coupled to $\phi_1$ of the clock circuitry 16. Similarly, capacitor 14b has one plate coupled to the anode of Schottky diode 12b and the cathode of Schottky diode 12c and the other plate coupled to $\phi_2$. Capacitor 14c has a first plate coupled to the anode of Schottky diode 12c and to the cathode of Schottky diode 12d and has the other plate coupled to $\phi_1$. Capacitor 14d has one plate coupled to the anode of Schottky diode 12d and to the regulation and control circuitry 18. The other plate of capacitor 14d is coupled to $\phi_2$. The output of the regulation and control circuitry 18 is a magnified negative voltage, shown as $-V_{pp}$.

In operation, the negative charge pump of FIG. 4 operates in a similar fashion to the charge pump of FIG. 1. Instead of pumping up the voltages, however, the clock cycles pull down the voltage at the anodes of each of the diodes 12a–d for each successive stage. The regulation and control circuitry turns off the clocks once a predetermined voltage has been realized.

The negative charge pump 56 may be fabricated as shown in FIG. 2 with the metal interconnect level modified to provide the proper connections. In the negative charge pump 56, it is not necessary to have separate tanks 22a–b; rather, a single tank 22 may be used.

It should be noted that while the present invention has been shown using four stages to produce a voltage useful for programming EEPROMs, more or fewer stages could be used to realize other voltages. Although the preferred embodiment of the present invention has been described in detail, it should be understood that various, substitutions and alterations could be made herein without departing from the spirit and scope of the invention as defined by the appended claims.

What is claimed is:

1. A charge pump comprising:
   first and second clocks having a predetermined phase differential;
   a plurality of Schottky diodes coupled in series; and
   a plurality of capacitors having first and second plates, said first plates coupled between said Schottky diodes and said second plates alternately coupled to said first and second clocks.

2. The charge pump of claim 1 wherein said Schottky diodes each comprise a layer of metal formed over a region of lightly doped semiconductor material.

3. The charge pump of claim 2 wherein said metal layer comprises platinum silicide.

4. The charge pump of claim 2 wherein said lightly doped semiconductor material comprises an n-doped silicon region.

5. The charge pump of claim 1 wherein said first capacitor comprises a heavily doped polysilicon layer overlying a lightly doped semiconductor region and separated therefrom by an insulating region.

6. The charge pump of claim 1 and further comprising a voltage source coupled to a first of said series connected Schottky diodes.

7. The charge pump of claim 6 wherein said voltage source is coupled to an anode of said first Schottky diode.

8. The charge pump of claim 6 wherein said voltage source is coupled to a cathode of said first Schottky diode.

9. The charge pump of claim 1 and further comprising voltage regulation circuitry coupled to a last of said series connected Schottky diodes.

10. The charge pump of claim 1 and further comprising control circuitry for pausing said clocks after a desired voltage has been generated.

11. A charge pump comprising:
   first and second clocks having a predetermined phase differential;
   a plurality of stages comprising:
      a capacitor having first and second plates, said first plate of alternating stages coupled to respective ones of said first and second clocks; and
      a Schottky diode coupled between the second plate of said capacitor and the second plate of the capacitor of the next stage.

12. The charge pump of claim 11 and further comprising a voltage source coupled to a first of said stages.

13. The charge pump of claim 12 and further comprising voltage regulation circuitry coupled to a last of said stages.

14. The charge pump of claim 13 and further comprising control circuitry coupled to said last of said stages for pausing said clocks after a predetermined voltage is generated.

15. A non-volatile memory comprising:
   an array of non-volatile memory cells;
   a plurality of wordlines coupled to said array;
   a plurality of bitlines coupled to said array;
   decode circuitry for selecting one of said wordlines;
   a charge pump coupled to said decode circuitry for generating a predetermined voltage on said selected wordline, said charge pump comprising:
      first and second clocks having a predetermined phase differential;
      a plurality of Schottky diodes coupled in series; and
      a plurality of capacitors having first and second plates, said first plates coupled between said Schottky diodes and said second plates alternately coupled to said first and second clocks.

16. The memory array of claim 15 wherein said non-volatile memory cells comprise EPROM cells.

17. The memory array of claim 15 wherein said non-volatile memory cells comprise EEPROM cells.

18. The memory array of claim 15 wherein said Schottky diode comprises a layer of metal formed over a region of lightly doped semiconductor material.

19. The memory array of claim 18 wherein said metal comprises platinum silicide.

20. The memory array of claim 18 wherein said lightly doped semiconductor material comprises an n-doped silicon region.

21. The memory array of claim 15 wherein said first capacitor comprises a heavily doped polysilicon layer overlying a lightly doped semiconductor region and separated therefrom by an insulating region.

22. The memory array of claim 15 wherein said second plate of a first capacitor is coupled to an anode of said Schottky diode and the second plate of a second capacitor is coupled to a cathode of said Schottky diode.

23. The memory array of claim 22 and further comprising a voltage source coupled to the second plate of a first capacitor.

24. The memory array of claim 15 and further comprising voltage regulation circuitry coupled to the second plate of a second capacitor.

25. The memory array of claim 15 and further comprising control circuitry for pausing said clocks after a desired voltage has been generated.

\* \* \* \* \*